INVENTORS P. W. DORMAN
M. SHOJI
BY Roderick B. Anderson
ATTORNEY 3,518,502
Patented June 30, 1970

3,518,502

CURRENT FUNCTION GENERATORS USING TWO-VALLEY SEMICONDUCTOR DEVICES

Paul W. Dorman, Somerville, and Masakazu Shoji, Plainfield, N.J., assignors to Bell Telephone Laboratories, Incorporated, Murray Hill, N.J., a corporation of New York Filed Apr. 25, 1968, Ser. No. 724,017
Int. Cl. H01g *7/00;* H01l *5/02*
U.S. Cl. 317—231 7 Claims

ABSTRACT OF THE DISCLOSURE

Currents are derived from an output electrode that is capacitively coupled to the active crystal of a two-valley semiconductor device. With a crystal of uniform configuration and doping and with uniform capacitive coupling, the output waveform is a replica of the configuration of the electrode. Various other effects are attained if non-uniform crystals or dielectric capacitance layers are used.

Background of the invention

This invention relates to pulse generators, and more particularly, to devices for generating pulses having a prescribed waveform.

Currents of specialized or particular waveform, known generally as current functions, are useful in a number of systems such as analog computers, logic circuits, test equipment, and current sources for display devices. For some applications, extremely short duration pulses of a high repetition rate are required. The desired wave configuration and wave frequency are normally obtained through the design of relatively complex circuitry involving the use of numerous passive and active electronic devices.

The copending application of M. Shoji, Ser. No. 610,638, filed Jan. 20, 1967, describes a high speed current function generator comprising a two-valley semiconductor crystal contained between opposite ohmic contacts. Upon application of a sufficient D-C voltage across the crystal, a narrow electric field domain is nucleated at the cathode contact and travels toward the anode with a substantially constant velocity and current density. During the transit of this domain from the cathode to the anode, the current flowing through the device drops to a relatively low value which is a function of the cross-sectional area of the device at the location of the domain. As a consequence, the output current from the anode contact depends upon the cross-sectional area of the device and is substantially a replica thereof. When the domain is extinguished at the anode contact, a sharp pulse or "pip" is also released to the external circuit.

The Shoji device is advantageous in that current waveforms of a prescribed configuration can be made by forming a crystal wafer to be of that same configuration, and the necessity for complicated external circuitry is avoided.

It is disadvantageous from the standpoint that the crystal wafer may in some cases be difficult to shape, and also, because the pip which occurs during each cycle is of the same polarity as the desired waveform. Because of this, it is difficult to process the output wave to eliminate the pip without effecting the desired waveform.

Summary of the invention

We have now found that current functions can be generated by capacitively coupling, to the active wafer of a two-valley semiconductor device, an electrode having a configuration that conforms to the desired current function. For example, if a triangular electrode is bonded to a thin dielectric layer covering one surface of a two-valley device wafer, and if traveling domains are excited in the wafer, triangular shaped pulses can be derived from the electrode. Since flat electrodes of an odd configuration are easier to fabricate than two-valley semiconductor crystals of such configuration, the present invention offers the advantage of greater simplicity of fabrication. Moreover, it will be shown that the waveform derived extends in a polarity direction which is opposite that of the unavoidable pip which makes the pip easier to eliminate from the output wave train if so desired.

As will be appreciated later, the output waveforms are not determined solely by the configuration of the output electrode, but rather are a function of a wave-shape parameter $(\epsilon V_p W v_0/d)$, where $\epsilon$ is the dielectric constant of the dielectric layer, $V_p$ is the voltage drop across the traveling electric field domain, W is the width of the output electrode, $v_0$ is the velocity of the traveling domain and $d$ is the thickness of the dielectric layer. In the example given above, only the width W of the electrode varies with distance to give a triangular output pulse, while the other elements of the wave-shape parameter are assumed to be uniform. However, the output pulses can also be shaped by using a non-uniform dielectric constant $\epsilon$, or a non-uniform dielectric thickness $d$ as will be explained more fully later.

For many purposes it is desired to generate pulses such as rectangular pulses that are free from irregularities or noise resulting from non-uniformities in the doping concentration of the crystal. Since doping non-uniformities result in fluctuations of the voltage $V_p$ across the traveling field domains, compensation for the effects of such non-uniformities can be made by adjusting the variation of electrode width W to give a uniform product of $V_p$ and W. When this is done, a uniform rectangular pulse may be derived from the electrode notwithstanding doping concentration fluctuations in the crystal.

Other embodiments to be described include a device having two output electrodes of different configuration for interleaving pulses of one shape with pulses of another shape.

In another embodiment current from two output electrodes of a single device are delivered to two different loads. The time delay between corresponding pulses is a direct function of the relative locations of the output electrode on the wafer. For example, with the two electrodes located at the same longitudinal distance from the cathode contact, current will be delivered to the two loads in phase and in synchronism.

These and other objects, features and advantages of the invention will be better understood from a consideration of the following detailed description taken in conjunction with the accompanying drawing, in which.

Figure 1A:
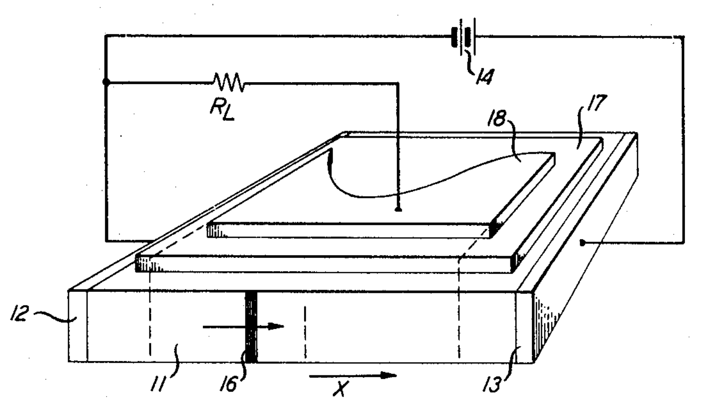
FIG. 1A is a schematic illustration of an illustrative embodiment of the invention.

Referring now to FIG. 1A there is shown an illustrative embodiment of the invention comprising a wafer 11 contained between a cathode contact 12 and an anode contact 13 which are connected to a suitable bias source 14. The wafer 11 is made of a suitable bulk-effect or two-valley semiconductor crystal such as n-type gallium arsenide which is capable of forming and propagating traveling electric field domains in response to an appropriately high applied bias voltage. As is known, for n-type gallium arsenide, the doping of the device should be reasonably uniform, it should be free of any rectifying barriers, and the product of doping concentration and length between opposite contacts should be greater than approximately $10^{12}$ carriers per square centimeter. Under these conditions, and with the voltage source 14 providing a bias in excess of a prescribed threshold, the electric field domain will form near the cathode contact 12 and propagate toward the anode contact 13 in a direction which shall be taken as the $x$ direction. When the domain 16 is extinguished at the anode contact 13, another domain is nucleated at the cathode contact and the process is repeated.

Located on one surface of the wafer 11 is a thin dielectric layer 17 on which is bonded an output electrode 18. A load resistance $R_L$ is connected between the output electrode 18 and the cathode. The load resistance may constitute a load for utilizing current from the output electrode, or alternatively, the voltage developed across the load resistance may be directed to a load for utilization.

Figure 1B:
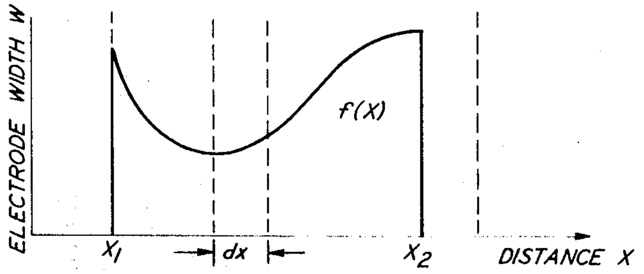
FIG. 1B is a graph of the output electrode width of the device of FIG. 1A with respect to distance.
Figure 1C:
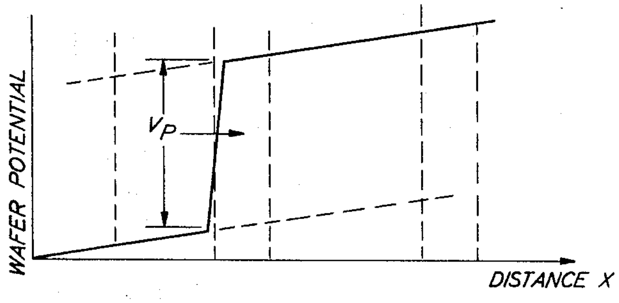
FIG. 1C is a graph of potential in the wafer of FIG. 1A with respect to distance.

Assuming that the wafer 11 is of substantially uniform cross-section and uniform doping concentration, and that the dielectric layer 17 is of substantially uniform thickness and dielectric constant, the current function delivered to the load resistance $R_L$ will have a shape that conforms to the configuration of electrode 18. As illustrated in FIG. 1B, the electrode 18 has a width W which is a function of $x$ between locations $x_1$ and $x_2$. As the traveling domain 16 moves a distance $dx$ it induces displacement currents in the output electrode 18 due to the voltage drop $V_p$ across the domain 16 as illustrated in FIG. 1C. As the domain moves through the distance $dx$, the charge on the output electrode 18 changes by a quantity $\nabla Q$ given by $$\Delta Q=\frac{\epsilon V_p}{d} f(x)dx \quad (1)$$

where $\epsilon$ is the dielectric constant of layer 17, $d$ is the thickness of the dielectric layer 18 and the width W of the electrode is a function of distance $f(x)$ as shown in FIG. 1B. Because the domain position is a function of the constant domain velocity $v_0$, the current I derived from electrode 18, which is equal to $dQ/dt$, may be expressed as $$I=\frac{\epsilon V_p}{d} v_0 f(v_0 t) \quad (2)$$

where $t$ is time, and $x=v_0 t$.

Equation 2 can therefore be expressed as the proportionality $$I \propto (\epsilon V_p W v_0 \div d) \quad (3)$$

Figure 2:
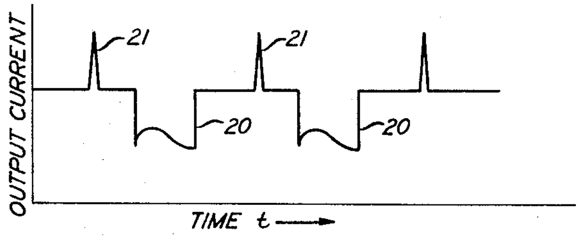
FIG. 2 is a graph of output current from the device of FIG. 1A.

The right-hand side of the relation $(\epsilon V_p W v_0 \div d)$ may be considered to be a wave-shape parameter, in that if any of the component parameters varies with distance, the current I will vary proportionately with time. Assuming that only the electrode width W varies with distance, then the current wave shape will be a replica of the electrode shape. This is illustrated in FIG. 2, which is a graph of current through $R_L$ in which the pulses 20 are substantial replicas of the electrode shape of FIG. 1B.

As each successive domain 16 is extinguished at the anode 13, a current pulse or pip 21 is excited in output electrode 18 due to the abrupt change in potential distribution in the wafer. However, unlike the current function generator of the aforementioned Shoji application, the pips 21 extend in an opposite direction from pulses 20 and can therefore easily be eliminated by external circuitry if so desired.

A device of the type shown in FIG. 1A has been made merely by using adhesive polyethylene tape to bond the output electrode to one side of a two-valley semiconductor wafer. The output current was relatively small because of the thickness of the polyethylene tape, and it is recommended that a thin coating of oxide or the like be used as the electric layer to maximize output.

As is clear from relationship (3), the wave-shaping parameter may vary with distance $x$ by varying any of the component parameters $\epsilon$, $V_p$, $v_0$ or $d$ with respect to distance, in addition to the width W of the electrode. A variation of $\epsilon$ would, of course, require a dielectric layer of a specified non-uniform constituency which would be somewhat difficult to fabricate. The voltage across the domain $V_p$ is a function of the cross-sectional area of the wafer and can therefore be varied with respect to distance by using a wafer of non-uniform cross section. $V_p$ is also a function of the doping concentration in the wafer, and so a non-uniform doping concentration likewise gives a non-uniform current output.

Figure 3:
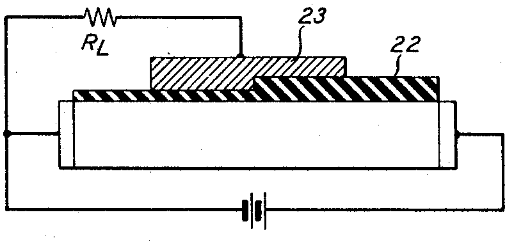
FIG. 3 is a schematic illustration of another embodiment of the invention.
Figure 4:
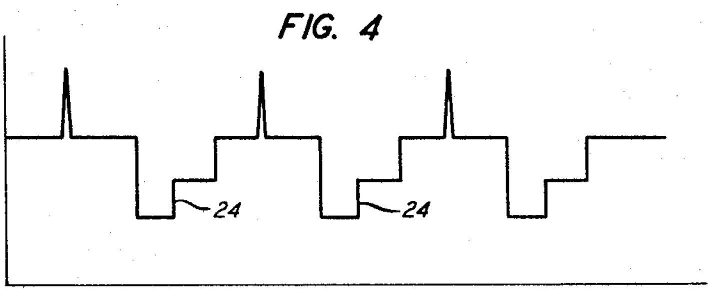
FIG. 4 is a graph of output current derived from the device of FIG. 3.

FIG. 3 illustrates a device in which the thickness $d$ of the dielectric wafer changes with respect to distance to give a desired wave output shown in FIG. 4. The thickness of the dielectric layer 22, which is bonded to the output electrode 23, varies as a step function. Assuming that the other parameters of the device are uniform, this gives output pulses 24 of FIG. 4 which likewise describe step functions.

Because of the relative difficulty of providing a prescribed non-uniform doping distribution in a two-valley semiconductor wafer, it is not anticipated that this method of causing variations of the voltage parameter $V_p$ will be a very attractive method of generating current functions. However, in most two-valley devices that are presently made, small doping non-uniformities inherently exist and constitute a source of noise in the generated output. From relationship (3) it can be seen that the parameter W can be varied to compensate for fluctuations in the parameter $V_p$ in order to maintain the entire wave-shape parameter constant.

Figure 5:
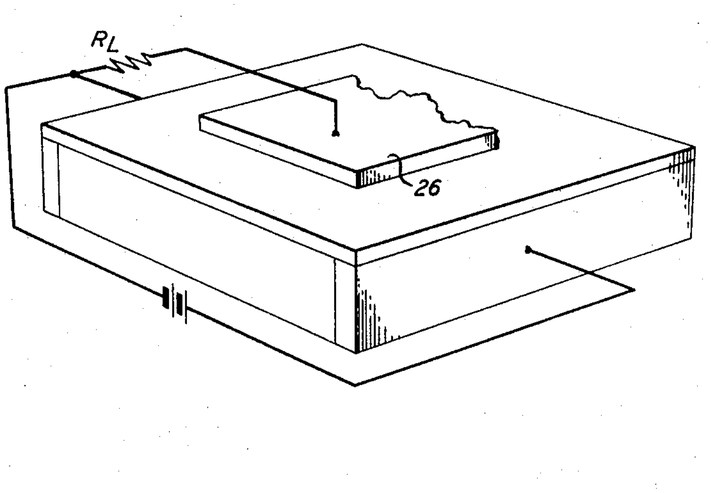
FIG. 5 is a schematic illustration of another embodiment of the invention.

This use for the invention is illustrated in FIG. 5 in which the output electrode 26 has a non-uniform width as a function of $x$ that compensates for fluctuations in the doping concentration in the $x$ direction. By this technique, the current delivered to the load $R_L$ is constant during the transit of each domain past the output electrode and hence, noise-free rectangular pulses are delivered to the load in spite of doping fluctuations in the wafer. Correct compensation is made when the product $WV_p$ is substantially uniform with distance, or more explicitly, when the waveshape parameter is uniform.

To the best of my knowledge, all current function generators that are presently known release repetitive waves or pulses each having the same current shape, and if it is desired to interleave pulses of one shape with pulses of another shape, rather elaborate circuitry for combining the outputs of two generators is required.

Figure 6:
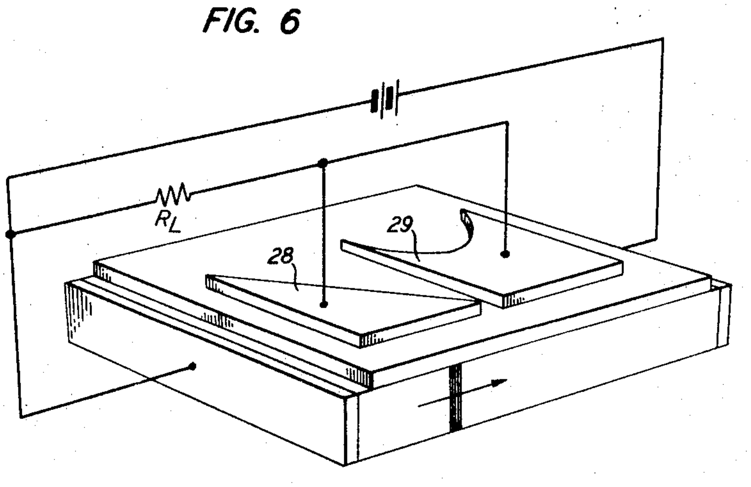
FIG. 6 is a schematic illustration of still another embodiment of the invention.
Figure 7:
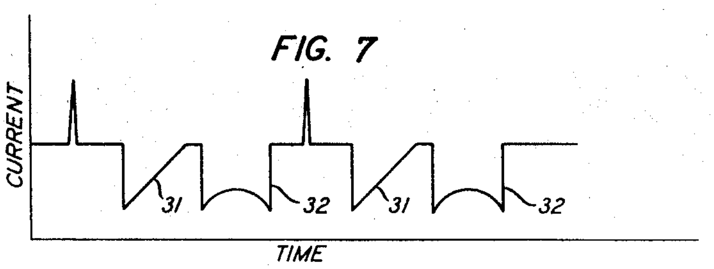
FIG. 7 is a graph of output current derived from the device of FIG. 6.

As illustrated in FIGS. 6 and 7, it is quite easy with the present invention to generate a wave train consisting of alternate pulses of different configuration. The output electrode 28 of FIG. 6 has a different shape from that of output electrode 29 to which it is directly connected. As a traveling domain passes output electrode 28, pulse 31 of FIG. 7 is generated, and as the domain passes an electrode 29 pulse 32 is generated. It is seen that while pulses 31 and 32 are repetitive, they are likewise interleaved as shown in FIG. 7.

Figure 8:
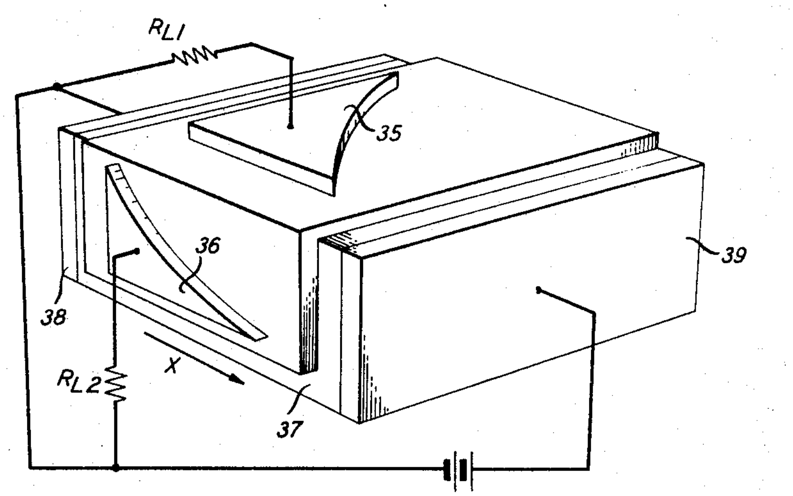
FIG. 8 is a schematic illustration of another embodiment of the invention.

Many electronic systems require current pulses to be delivered to one load in synchronism with current pulses delivered to a different load. This can be done very conveniently by the apparatus illustrated in FIG. 8 in which identical output electrodes 35 and 36 are capacitively coupled to a wafer 37 at identical distances from the cathode 38 and the anode 39. Under this condition, the domains will scan output electrodes 35 and 36 at precisely the same time and cause current to be delivered to load $R_{L1}$ in phase with current delivered to $R_{L2}$. Of course, by locating electrode 36 at a different location from that of electrode 35, a precisely determined delay or phase shift can be established between current pulses delivered to load $R_{L1}$ with respect to those delivered to $R_{L2}$. That is, if electrode 36 is located at a position which is further from cathode 38 than electrode 35 by a distance $\Delta x$, the pulses arriving at source $R_{L2}$ lag those arriving at $R_{L2}$ by a time which is equal to $\Delta x/v_0$ The foregoing has assumed that the only currents excited in the output electrodes are displacement currents resulting from capacitive coupling between the wafer and the ouput electrodes. If the dielectric layer is not a good insulator, conduction currents will flow between the wafer and the electrode which will modify the output in a manner which can readily be ascertained by those skilled in the art. Moreover, the principles of the invention may be used with negative resistance piezoelectric materials using phonon-carrier interaction as is generally described, for example, in the copending application of Hakki, Ser. No. 638,417, filed May 15, 1967 and assigned to Bell Telephone Laboratories, Incorporated. Various other modifications and embodiments of the invention may be made by those skilled in the art without departing from the spirit and scope of the invention.

What is claimed is:

1. A current function generator comprising:

a semiconductor wafer including means capable of forming and propagating traveling electric field domains in response to the application of a sufficient bias voltage;

cathode and anode contacts connected to the wafer;

means for applying sufficient voltage to the contacts to cause traveling domains to propagate in a first direction through the wafer;

a high resistivity layer on one surface of the wafer; and means for generating current pulses varying as a function of time, said generating means including an electrode bonded to the high resistivity layer and having a width that varies transversely with distance in said first direction in proportion to a prescribed amplitude variation for said current pulses; and means for deriving utilization current pulses from the electrode.

2. The current function generator of claim 1 wherein:

the high resistivity layer is a dielectric of substantially uniform thickness and dielectric constant, and the wafer is of substantially uniform cross-sectional area in a plane transverse to said first direction and of substantially uniform doping concentration, whereby the shape of pulses derived from the electrode are substantial replicas of the electrode shape.

3. The current function generator of claim 1 wherein:

the electrode is a first electrode, the current pulses are first current pulses, and the utilization means comprises a first load; and further comprising:

a second load;

means for generating and transmitting to the second load second current pulses that are synchronized with the first current pulses comprising a second electrode spaced from the wafer by a high resistivity layer.

4. The current function generator of claim 3 wherein:

the second electrode is spaced the same distance in said first direction from the cathode contact as is the first electrode, whereby each second pulse is generated at the same instant as is a corresponding first pulse.

5. The current function generator of claim 1 wherein:

the electrode is a first electrode, the current pulses are first current pulses, and the utilization means comprises a load; and further comprising:

means for generating second current pulses having waveforms that differ from those of the first current pulses comprising a second electrode spaced in said first direction from the first electrode and having a configuration that differs from the configuration of the first electrode;

the second electrode being connected to the first electrode, whereby the second pulses are interleaved with the first pulses.

6. Apparatus comprising:

a semiconductor wafer including means capable of forming and propagating traveling electric field domains in response to the application of a sufficient bias voltage;

cathode and anode contacts connected to the wafer;

means for applying sufficient voltage to the contacts to cause traveling domains to propagate in a first direction through the wafer, each domain being characterized by a voltage drop $V_p$ across the domain; and means for generating non-rectangular current pulses each having a peak amplitude that varies as a prescribed function of time comprising an electrode capacitively coupled to the wafer through a dielectric medium of dielectric constant $\epsilon$ and thickness $d$, the electrode extending in said first direction from a first point between said cathode and anode to a second point therebetween and having a width W in the direction transverse to said first direction;

the product of the dielectric constant $\epsilon$, the voltage $V_p$ across the domain, the width of the electrode W, and the velocity of the traveling domain $v_0$ divided by the thickness $d$ of the dielectric medium constituting a wave-shaping parameter defined by the expression $(\epsilon V_p W v_0 \div d)$;

said wave-shaping parameter varying in the region between said first and second points as a function of distance in a manner which is substantially defined by said prescribed function of time.

7. In a two-valley device in which traveling electric field domains propagate in a first direction between anode and cathode contacts, thereby giving a current flow in the contacts that oscillate between a relatively low value during the time in which each domain is in transit and a relatively high value when each domain is extinguished and said current fluctuates about said low value as a result of doping density non-uniformities in the wafer, the improvement comprising:

an electrode capacitively coupled to the wafer which extends in said first direction between first and second locations and which has a width W in a direction transverse to said first direction;

and means for deriving utilization current pulses from the electrode;

the width W of the electrode being non-uniform with respect to distance in said first direction;

and the product of the width W and the doping density of the wafer at successive locations between said first and second locations being substantially uniform, whereby the electrode non-uniformities compensate for doping density non-uniformities of the wafer to reduce the noise of the pulse output.

References Cited

UNITED STATES PATENTS

| | | | |
|---|---|---|---|
| 3,339,153 | 8/1967 | Hakki | 317—234 X |
| 3,365,583 | 1/1968 | Gunn | 317—234 X |
| 3,451,011 | 6/1969 | Venohara | 317—234 X |
| 3,452,222 | 1/1969 | Shoji | 317—234 X |

JAMES D. KALLAM, Primary Examiner

U.S. Cl. X.R.

317—234; 307—229, 260, 299